United States Patent
Yamazaki

(10) Patent No.: US 11,656,110 B2
(45) Date of Patent: May 23, 2023

(54) SENSOR

(71) Applicant: KABUSHIKI KAISHA TOSHIBA, Tokyo (JP)

(72) Inventor: Hiroaki Yamazaki, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/445,933

(22) Filed: Aug. 25, 2021

(65) Prior Publication Data

US 2022/0291027 A1 Sep. 15, 2022

(30) Foreign Application Priority Data

Mar. 15, 2021 (JP) .............................. JP2021-041023

(51) Int. Cl.
*G01F 1/684* (2006.01)
*G01N 27/22* (2006.01)
*G01N 27/04* (2006.01)

(52) U.S. Cl.
CPC ............ *G01F 1/684* (2013.01); *G01F 1/6845* (2013.01); *G01N 27/045* (2013.01); *G01N 27/221* (2013.01); *G01N 27/226* (2013.01); *B81B 2201/02* (2013.01); *B81B 2203/04* (2013.01); *B81B 2203/053* (2013.01); *B81B 2203/058* (2013.01)

(58) Field of Classification Search
CPC ..... G01F 1/684; G01F 1/6845; G01N 27/045; G01N 27/221; G01N 27/226; B81B 2201/02; B81B 2203/04; B81B 2203/053; B81B 2203/058

See application file for complete search history.

(56) References Cited

U.S. PATENT DOCUMENTS

| | | | | |
|---|---|---|---|---|
| 8,264,241 B2* | 9/2012 | Slezak | ................. | G01N 27/226 324/658 |
| 8,564,928 B2* | 10/2013 | Ikehashi | .................. | H01G 5/16 361/290 |
| 9,013,193 B2* | 4/2015 | Tsuruta | ................ | G01N 27/226 324/690 |
| 2006/0220499 A1* | 10/2006 | Ikehashi | .................. | H01G 5/16 310/348 |
| 2008/0239528 A1* | 10/2008 | Masunishi | ......... | G02B 26/0825 359/847 |

(Continued)

FOREIGN PATENT DOCUMENTS

JP 2018-506042 3/2018

*Primary Examiner* — Ryan D Walsh
(74) *Attorney, Agent, or Firm* — Finnegan, Henderson, Farabow, Garrett & Dunner, LLP

(57) ABSTRACT

According to one embodiment, a sensor includes a first member including a first member surface, and a first element part. The first element part includes a first fixed electrode fixed to the first member surface, and a first movable electrode facing the first fixed electrode. The first fixed electrode is along the first member surface. A gap is located between the first movable electrode and the first fixed electrode. The first movable electrode includes a first surface and a second surface. The first surface is between the first fixed electrode and the second surface. At least one of the first surface or the second surface is non-parallel to the first member surface.

18 Claims, 8 Drawing Sheets

(56) References Cited

U.S. PATENT DOCUMENTS

| | | | |
|---|---|---|---|
| 2009/0296308 A1* | 12/2009 | Kawakubo | H01G 5/16 |
| | | | 361/290 |
| 2010/0235107 A1* | 9/2010 | Fukumura | G01N 27/226 |
| | | | 73/23.31 |
| 2014/0268482 A1* | 9/2014 | DeReus | B81B 3/0051 |
| | | | 361/290 |
| 2015/0266717 A1* | 9/2015 | Okamoto | H01L 41/12 |
| | | | 257/418 |
| 2015/0284239 A1* | 10/2015 | Williams | B81B 3/0051 |
| | | | 257/421 |
| 2016/0245681 A1 | 8/2016 | Maginnis et al. | |
| 2016/0272481 A1* | 9/2016 | Yamazaki | B81B 3/0008 |
| 2019/0086377 A1* | 3/2019 | Ikehashi | G01N 27/221 |
| 2021/0175035 A1* | 6/2021 | Yamazaki | H01H 1/0036 |
| 2022/0018820 A1* | 1/2022 | Hiramatsu | G01N 27/228 |

* cited by examiner

SENSOR

CROSS-REFERENCE TO RELATED APPLICATIONS

This application is based upon and claims the benefit of priority from Japanese Patent Application No. 2021-041023, filed on Mar. 15, 2021; the entire contents of which are incorporated herein by reference.

FIELD

Embodiments described herein relate generally to a sensor.

BACKGROUND

For example, there is a sensor that uses a MEMS (Micro Electro Mechanical Systems) element or the like. It is desirable to improve the characteristics of the sensor.

DETAILED DESCRIPTION

Figure 1A:
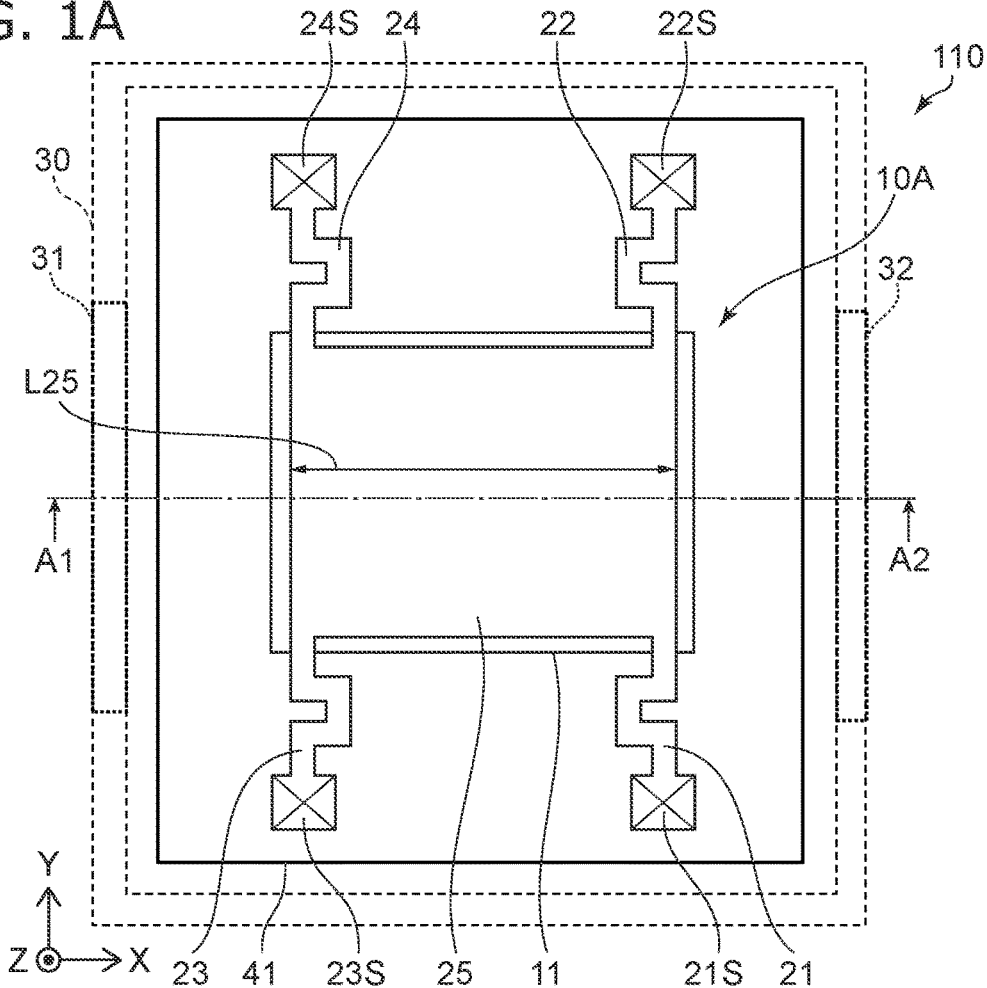
FIGS. 1A and 1B are schematic views illustrating a sensor according to a first embodiment.

According to one embodiment, a sensor includes a first member including a first member surface, and a first element part. The first element part includes a first fixed electrode fixed to the first member surface, and a first movable electrode facing the first fixed electrode. The first fixed electrode is along the first member surface. A gap is located between the first movable electrode and the first fixed electrode. The first movable electrode includes a first surface and a second surface. The first surface is between the first fixed electrode and the second surface. At least one of the first surface or the second surface is non-parallel to the first member surface.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
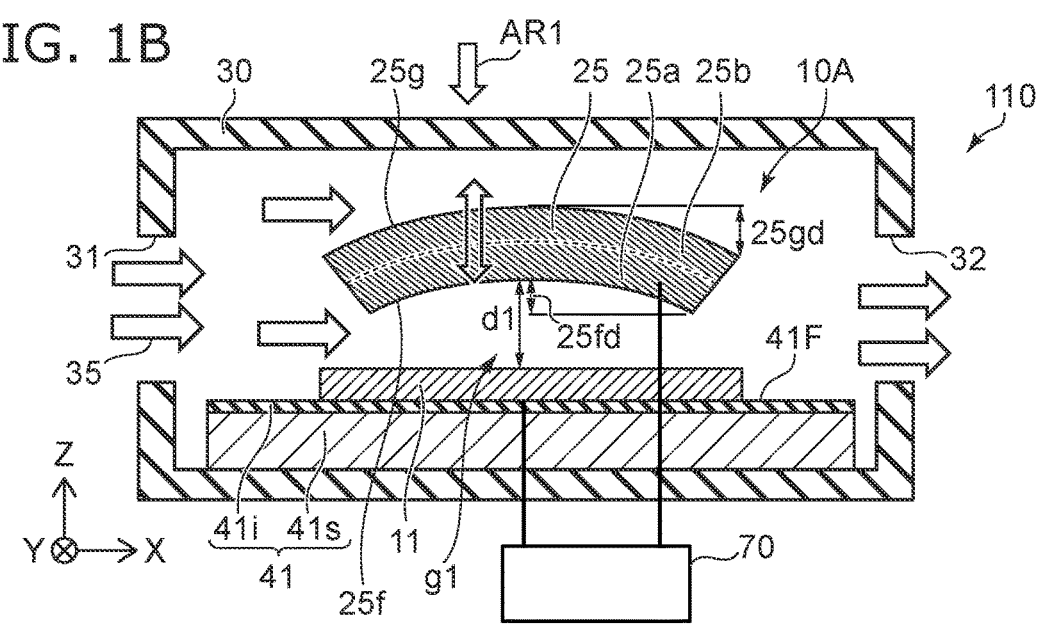

FIGS. 1A and 1B are schematic views illustrating a sensor according to a first embodiment.

FIG. 1A is a see-through plan view as viewed along arrow AR1 of FIG. 1B. FIG. 1B is a line A1-A2 cross-sectional view of FIG. 1A.

As shown in FIGS. 1A and 1B, the sensor 110 according to the embodiment includes a first member 41 and a first element part 10A.

The first member 41 is, for example, a base body. In the example, the first member 41 includes a substrate 41$s$ and an insulating layer 41$i$. The substrate 41$s$ is, for example, a silicon substrate. The substrate 41$s$ may include a control element such as a transistor, etc. The insulating layer 41$i$ is located on the substrate 41$s$. For example, the first element part 10A is located on the insulating layer 41$i$. According to the embodiment, the first member 41 may include interconnects, etc. (not illustrated). For example, the interconnects electrically connect the first element part 10A and the substrate 41$s$. The interconnects may include contact vias.

The first member 41 includes a first member surface 41F. The first member surface 41F is, for example, the upper surface.

A direction perpendicular to the first member surface 41F is taken as a Z-axis direction. A direction perpendicular to the Z-axis direction is taken as an X-axis direction. A direction perpendicular to the Z-axis direction and the X-axis direction is taken as a Y-axis direction.

The first element part 10A includes a first fixed electrode 11 and a first movable electrode 25. The first fixed electrode 11 is fixed to the first member surface 41F. For example, the first fixed electrode 11 is located on the insulating layer 41$i$. The first fixed electrode 11 is along the first member surface 41F. For example, the upper surface of the first fixed electrode 11 is substantially perpendicular to the first member surface 41F.

As shown in FIG. 1B, the first movable electrode 25 faces the first fixed electrode 11. A gap g1 is located between the first movable electrode 25 and the first fixed electrode 11.

As shown in FIG. 1A, the first movable electrode 25 may be supported by support members (e.g., first to fourth support members 21 to 24, etc.). For example, the first to fourth support members 21 to 24 are respectively supported by first to fourth fixed members 21S to 24S. The first movable electrode 25 is supported by the first to fourth support members 21 to 24 to be separated from the first fixed electrode 11.

The first movable electrode 25 includes a first surface 25$f$ and a second surface 25$g$. The first surface 25$f$ is between the first fixed electrode 11 and the second surface 25$g$. The first surface 25$f$ is, for example, the lower surface. The second surface 25$g$ is, for example, the upper surface.

At least one of the first surface 25$f$ or the second surface 25$g$ is non-parallel to the first member surface 41F. For example, the first surface 25$f$ is convex or concave. For example, the second surface 25$g$ is convex or concave. In the example, the first surface 25$f$ is concave. In the example, the second surface 25$g$ is convex. In the example, when the first movable electrode 25 is viewed from a position on the first movable electrode 25, the first surface 25$f$ is upwardly convex, and the second surface 25$g$ is upwardly convex.

As shown in FIG. 1B, a fluid 35 can flow along the first member surface 41F through the gap g1. The electrical capacitance changes according to the flow of the fluid 35. For example, a distance d1 between the first fixed electrode 11 and the first movable electrode 25 changes according to the flow of the fluid 35 that flows along the first member surface 41F through the gap g1.

For example, when the fluid 35 flows through the gap g1, a force (e.g., lift) that has a Z-axis direction component acts on the first movable electrode 25. Thereby, the first movable electrode 25 is displaced along the Z-axis direction. The distance d1 between the first fixed electrode 11 and the first movable electrode 25 is changed thereby. As a result, the electrical capacitance between the first fixed electrode 11 and the first movable electrode 25 changes.

Information that relates to information (e.g., the flow rate per unit time, etc.) that relates to the flow of the fluid 35 is obtained by detecting the change of the electrical capacitance. For example, detection with high sensitivity is possible.

The power consumption for the detection of the change of the electrical capacitance is small. The embodiment has low power consumption. A low power-consumption flow rate sensor can be provided. According to the embodiment, a sensor can be provided in which the characteristics can be improved.

The sensor 110 may include a controller 70. The controller 70 is electrically connected with the first fixed electrode 11 and the first movable electrode 25. The controller 70 is configured to detect the electrical capacitance.

According to the embodiment, the fluid 35 may be able to flow along the second surface 25g. By setting the second surface 25g to be curved or oblique to the first member surface 41F, a force that includes a Z-axis direction component acts on the second surface 25g. Thereby, the first movable electrode 25 may be displaced along the Z-axis direction.

According to the embodiment, the fluid 35 may be a gas or a liquid.

According to the embodiment, the sensor 110 may further include a housing 30. The housing 30 includes a first opening 31 and a second opening 32. A first direction from the first opening 31 toward the second opening 32 is along the first member surface 41F. The first direction is, for example, the X-axis direction. The fluid 35 can pass through a path between the first opening 31 and the second opening 32. The path includes the gap g1. The path may be along the second surface 25g.

As shown in FIG. 13, at least one of the first surface 25f or the second surface 25g is non-parallel to the first member surface 41F when the first movable electrode 25 is cut at the X-Z plane (a first cross section that is perpendicular to the first member surface 41F and along the first direction).

The first movable electrode 25 is displaced along the Z-axis direction by the fluid 35 flowing along the first and second surfaces 25f and 25g that have such shapes.

In one example as shown in FIG. 1B, the first movable electrode 25 may include first and second layers 25a and 25b. The first layer 25a is between the first fixed electrode 11 and the second layer 25b. The first layer 25a is the lower layer. The second layer 25b is the upper layer. The second layer 25b includes a different material from the material of the first layer 25a. For example, multiple layers of different materials are stacked. Thereby, stress is easily generated in the first movable electrode 25. Thereby, the first movable electrode 25 is easily caused to be non-parallel to the X-Y plane (e.g., curved).

As shown in FIG. 1A, the length of the first movable electrode 25 along the first direction (in the example, the X-axis direction) is taken as a length L25. The length L25 is, for example, not less than 100 µm and not more than 500 µm. A first warp amount 25fd of the first surface 25f (referring to FIG. 1B) is, for example, not less than 1 µm and not more than 30 µm. A second warp amount 25gd of the second surface 25g (referring to FIG. 1B) is, for example, not less than 1 µm and not more than 30 µm.

The first surface 25f includes a first end portion in the first direction (in the example, the X-axis direction) and a first central portion in the first direction. The first warp amount 25fd of the first surface 25f corresponds to the distance along a second direction (the Z-axis direction) perpendicular to the first member surface between the second-direction position of the first end portion and the second-direction position of the first central portion.

The second surface 25g includes a second end portion in the first direction (in the example, the X-axis direction) and a second central portion in the first direction. The second warp amount 25gd of the second surface 25g corresponds to the distance along the second direction (the Z-axis direction) perpendicular to the first member surface between the second-direction position of the second end portion and the second-direction position of the second central portion.

According to the embodiment, the ratio of the first warp amount 25fd to the length L25 of the first movable electrode 25 is, for example, not less than 0.002 and not more than 0.3. The ratio of the second warp amount 25gd to the length L25 of the first movable electrode 25 is, for example, not less than 0.002 and not more than 0.3.

Figure 2A:
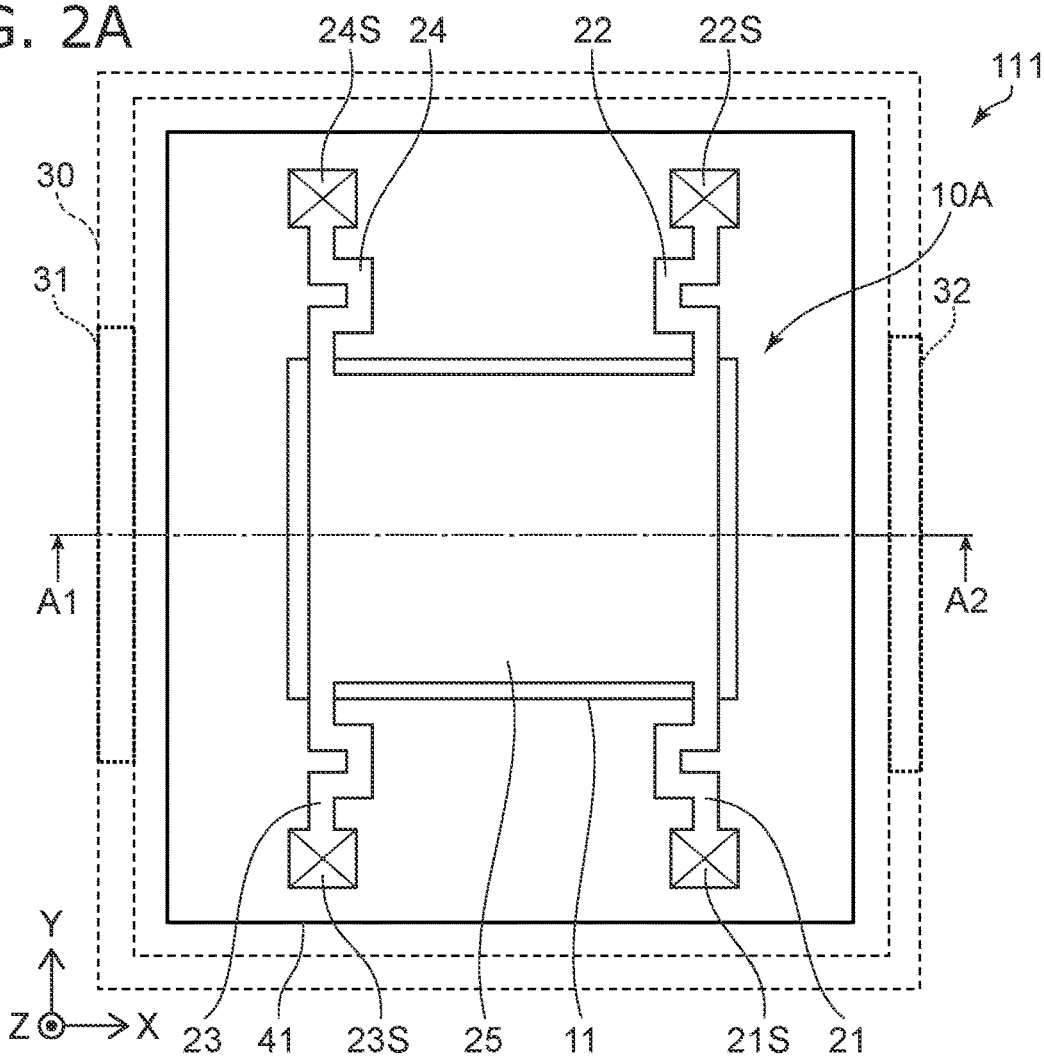
FIGS. 2A and 2B are schematic views illustrating a sensor according to the first embodiment.
Figure 2B:
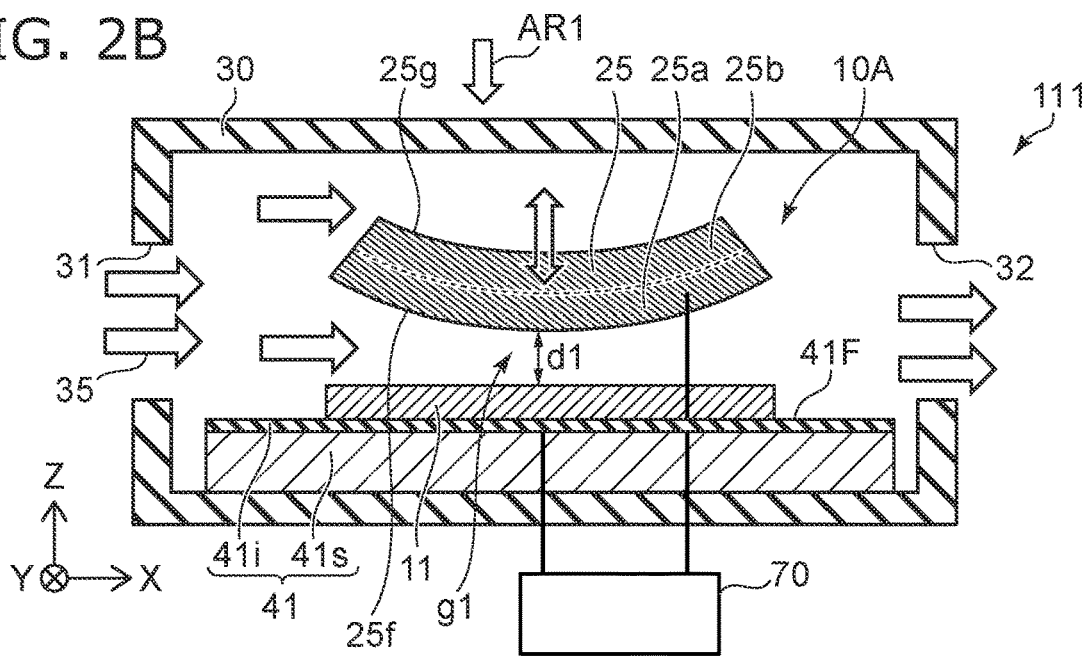

FIGS. 2A and 2B are schematic views illustrating a sensor according to the first embodiment.

FIG. 2A is a see-through plan view as viewed along arrow AR1 of FIG. 2B. FIG. 2B is a line A1-A2 cross-sectional view of FIG. 2A.

In the sensor 111 according to the embodiment as shown in FIG. 2B, the first surface 25f is convex, and the second surface 25g is concave.

Figure 3A:
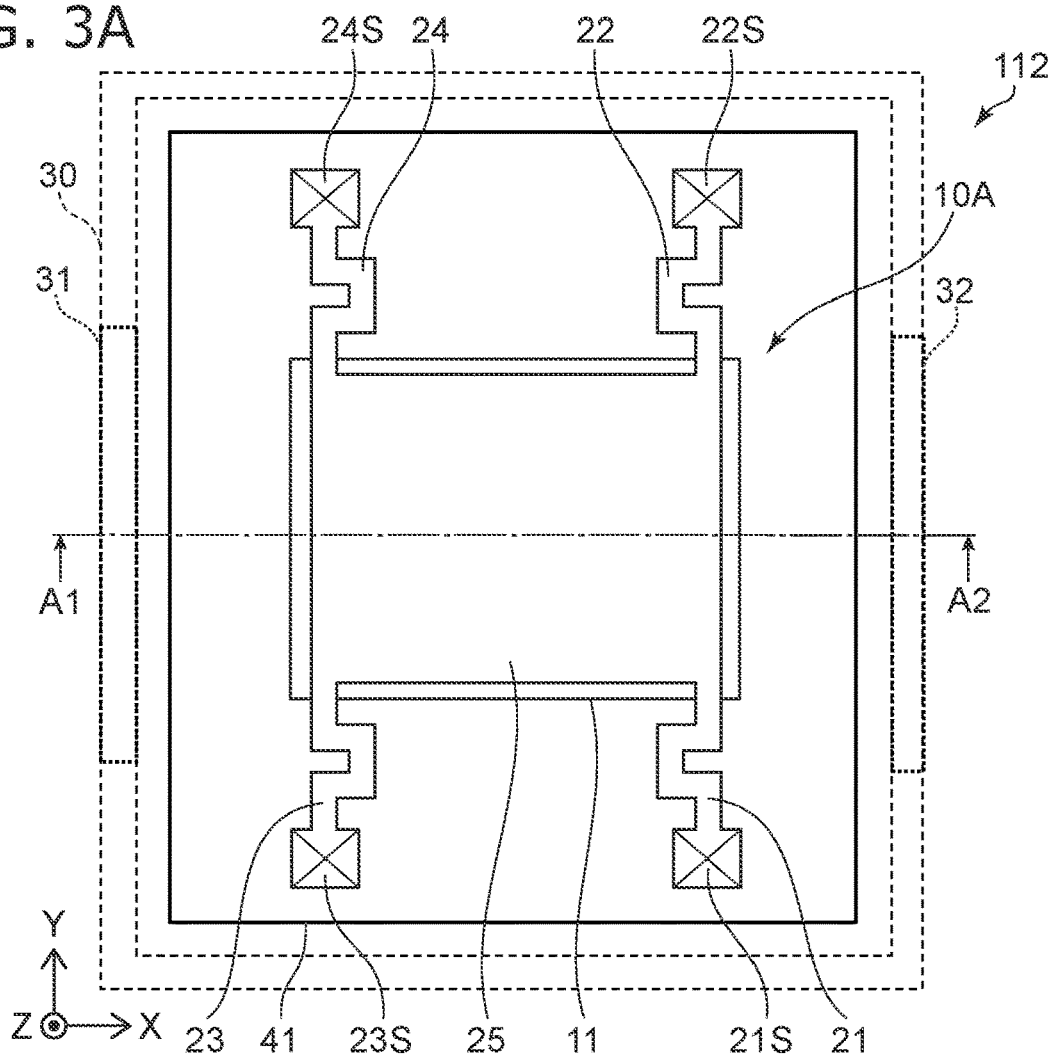
FIGS. 3A and 3B are schematic views illustrating a sensor according to the first embodiment.
Figure 3B:
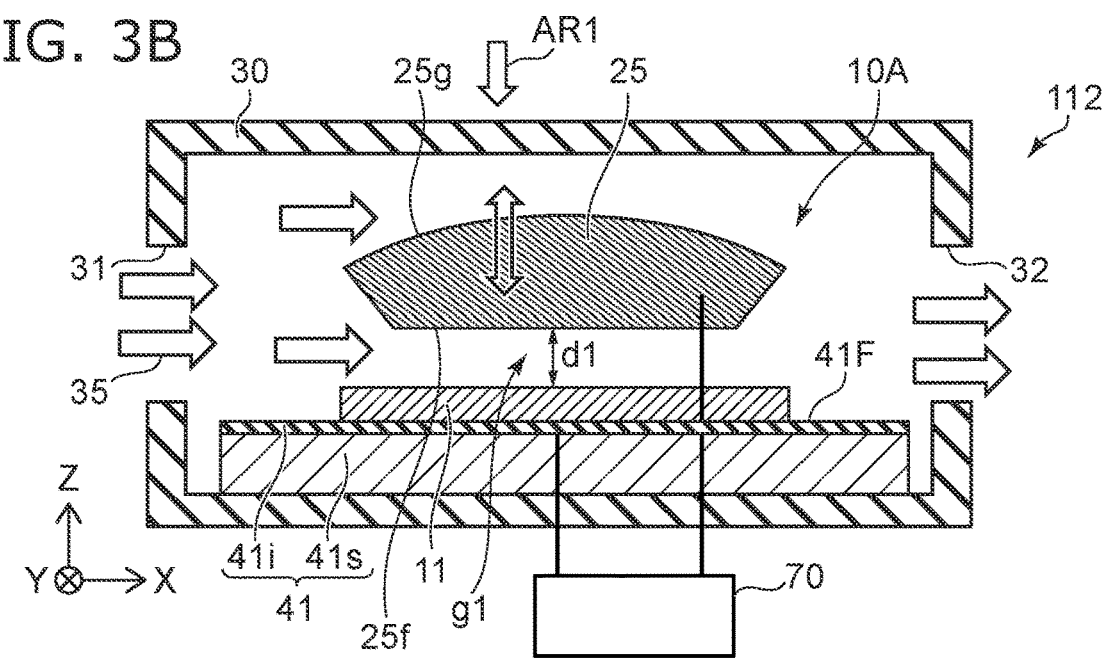

FIGS. 3A and 3B are schematic views illustrating a sensor according to the first embodiment.

FIG. 3A is a see-through plan view as viewed along arrow AR1 of FIG. 3B. FIG. 3B is a line A1-A2 cross-sectional view of FIG. 3A.

In the sensor 112 according to the embodiment as shown in FIG. 3B, the first surface 25f is substantially a plane, and the second surface 25g is convex.

Figure 4A:
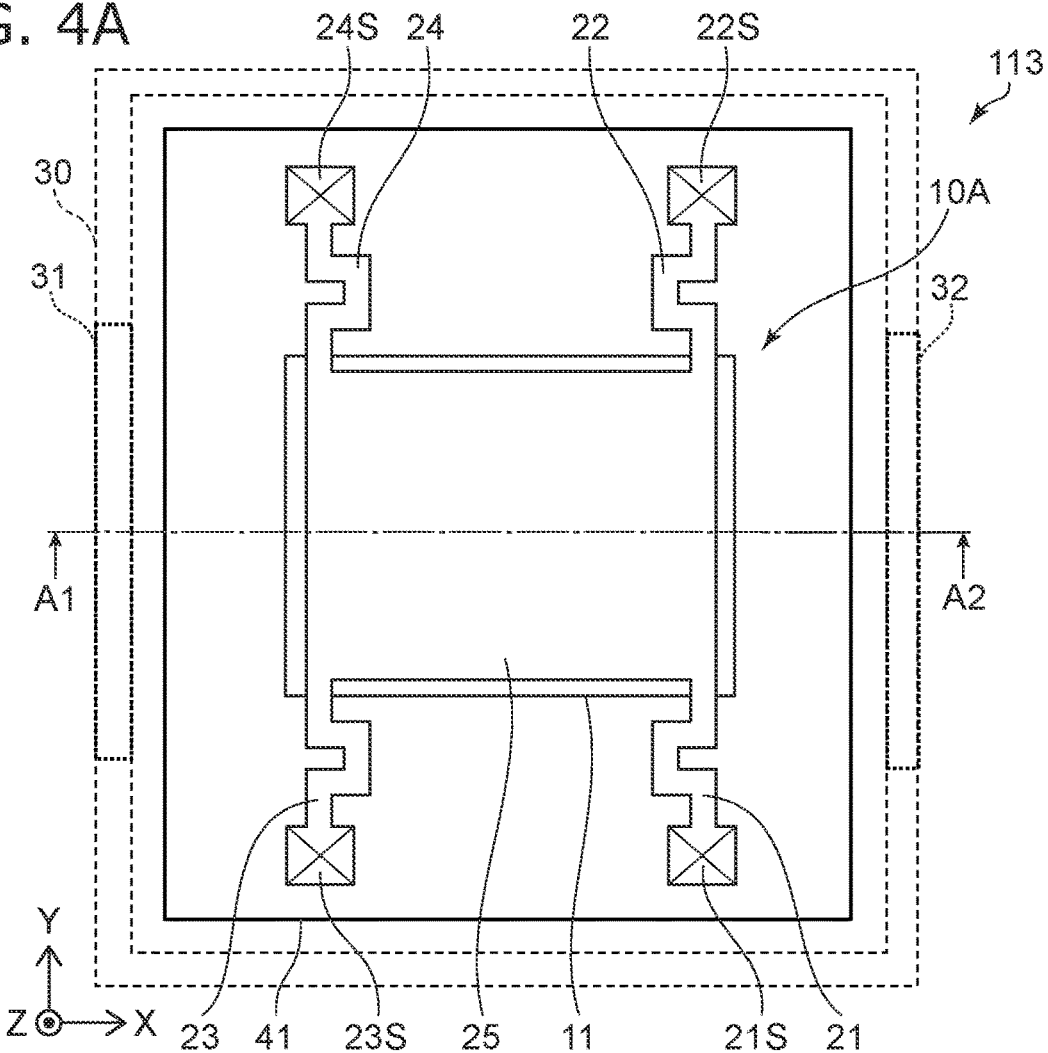
FIGS. 4A and 4B are schematic views illustrating a sensor according to the first embodiment.
Figure 4B:
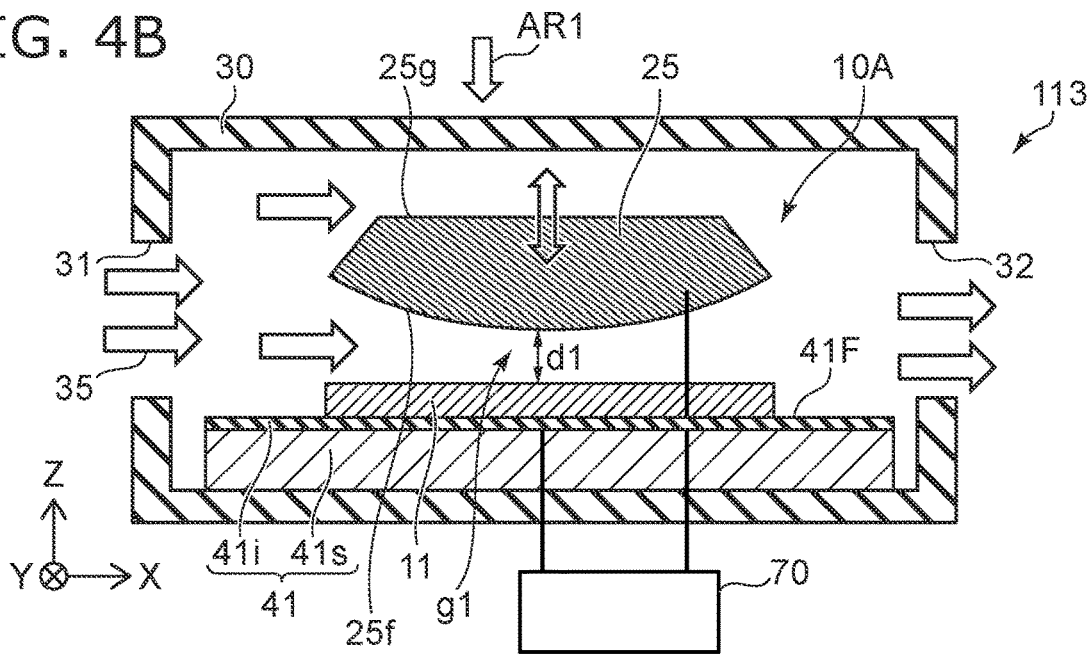

FIGS. 4A and 4B are schematic views illustrating a sensor according to the first embodiment.

FIG. 4A is a see-through plan view as viewed along arrow AR1 of FIG. 4B. FIG. 4B is a line A1-A2 cross-sectional view of FIG. 4A.

In the sensor 113 according to the embodiment as shown in FIG. 4B, the first surface 25f is convex, and the second surface 25g is substantially a plane.

Figure 5A:
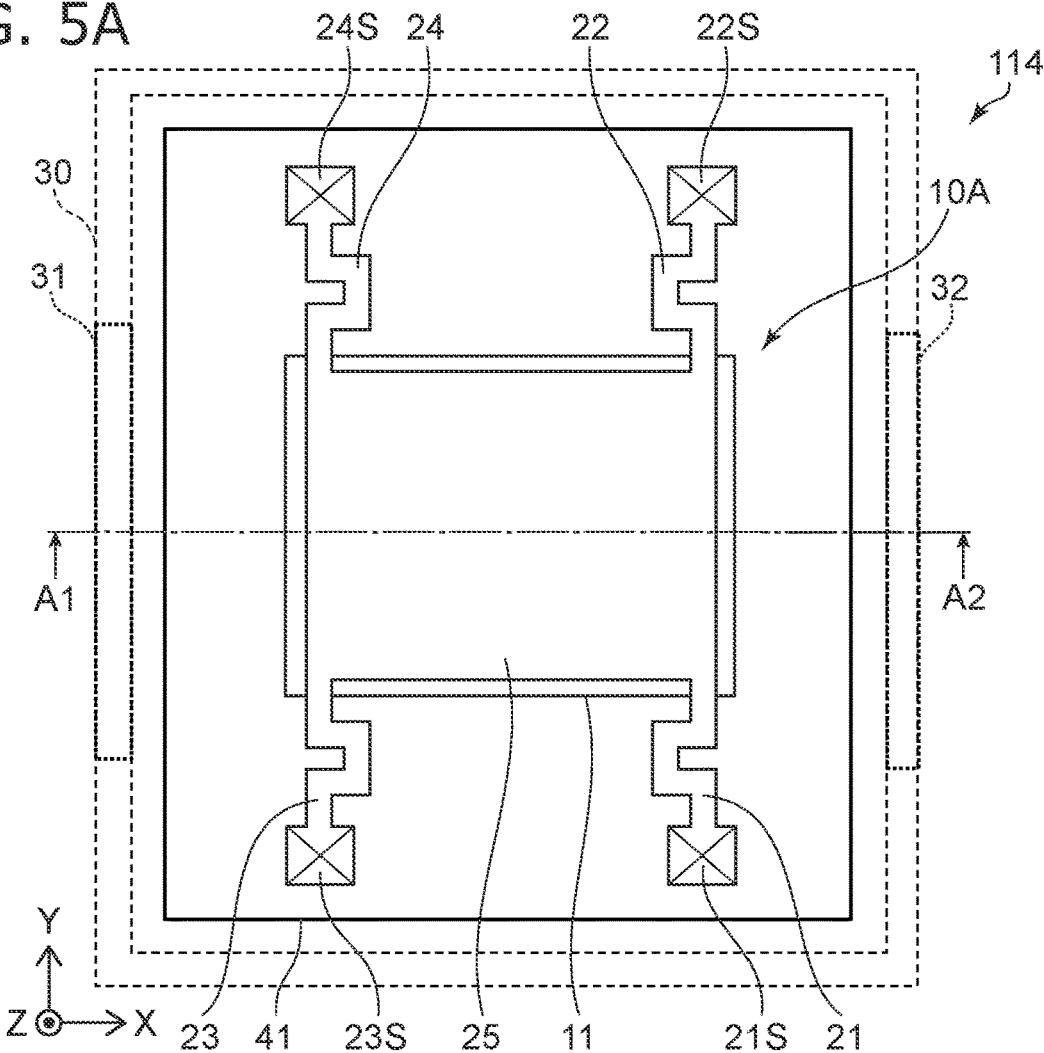
FIGS. 5A and 5B are schematic views illustrating a sensor according to the first embodiment.
Figure 5B:
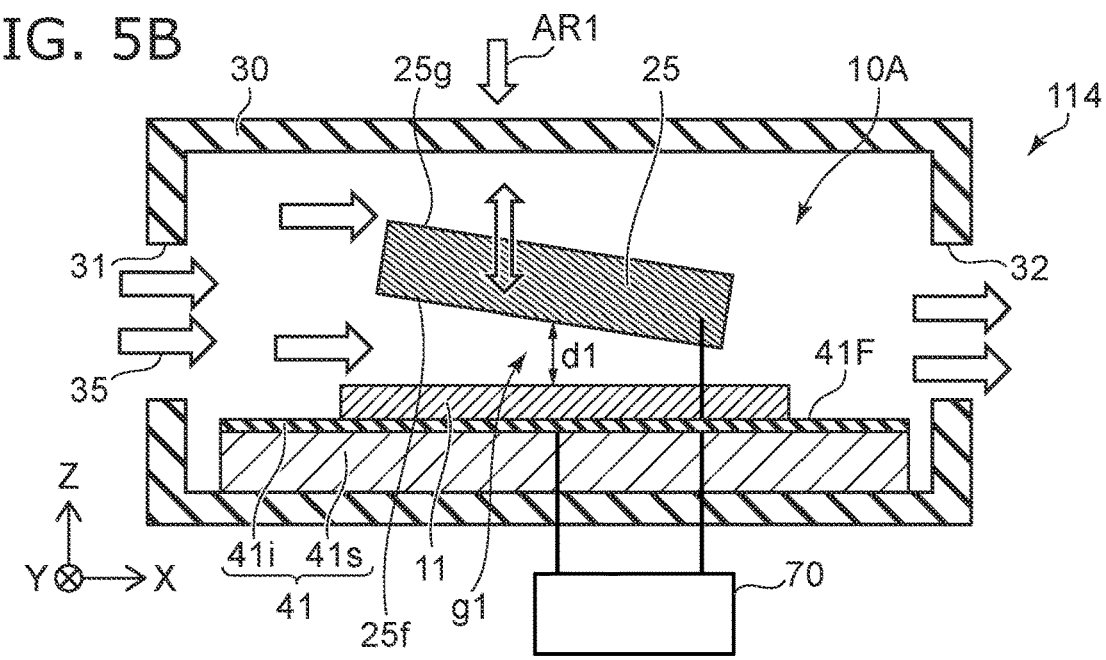

FIGS. 5A and 5B are schematic views illustrating a sensor according to the first embodiment.

FIG. 5A is a see-through plan view as viewed along arrow AR1 of FIG. 5B. FIG. 5B is a line A1-A2 cross-sectional view of FIG. 5A.

In the sensor 114 according to the embodiment as shown in FIG. 5B, the first surface 25f and the second surface 25g are substantially planes. The first surface 25f and the second surface 25g are oblique to the first member surface 41F.

Otherwise, the configurations of the sensors 111 to 114 described above may be similar to the configuration of the sensor 110. In the sensors 111 to 114 as well, a signal that corresponds to the flow of the fluid 35 (e.g., a signal that corresponds to the electrical capacitance) is obtained. For example, a low power-consumption flow rate sensor can be provided. A sensor can be provided in which the characteristics can be improved.

Figure 6A:
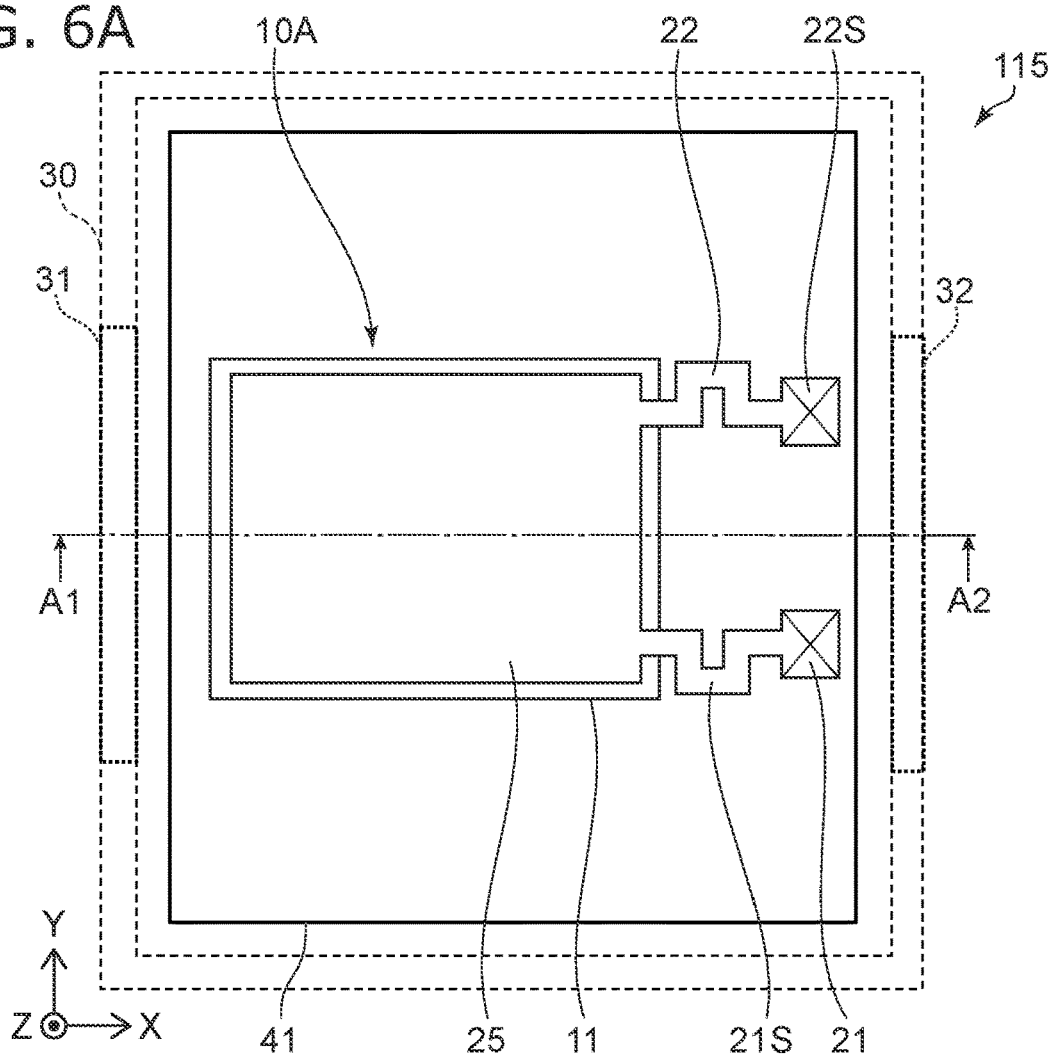
FIGS. 6A and 6B are schematic views illustrating a sensor according to the first embodiment.
Figure 6B:
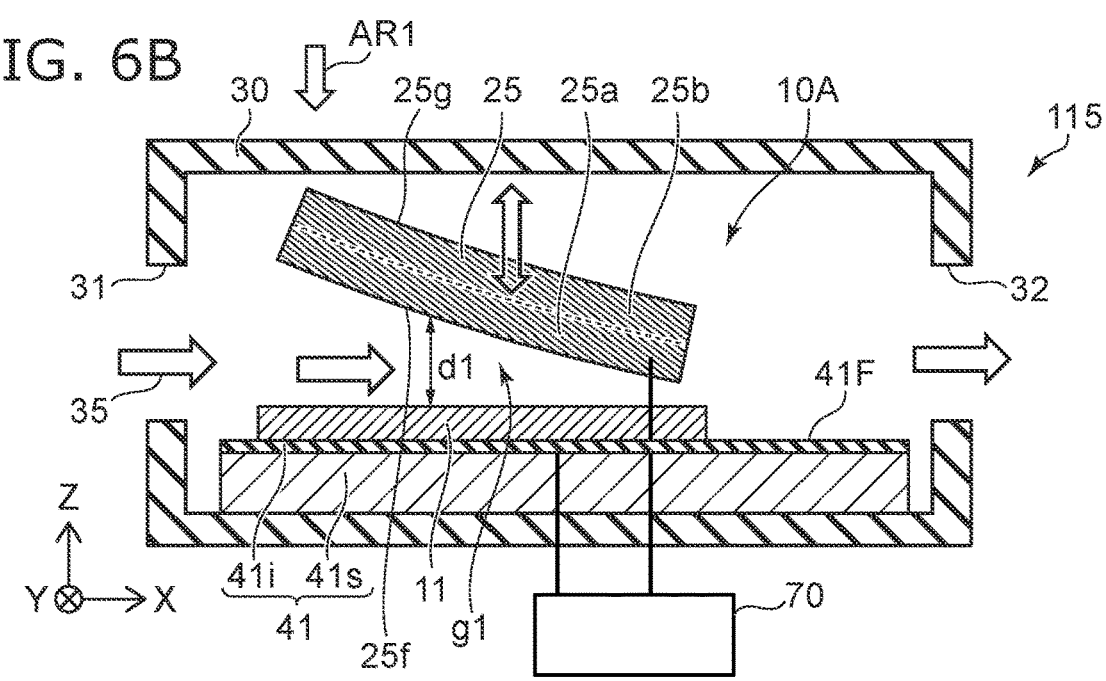

FIGS. 6A and 6B are schematic views illustrating a sensor according to the first embodiment.

FIG. 6A is a see-through plan view as viewed along arrow AR1 of FIG. 6B. FIG. 6B is a line A1-A2 cross-sectional view of FIG. 6A.

In the sensor 115 according to the embodiment as shown in FIG. 6A, the first movable electrode 25 is supported by two support members (the first support member 21 and the second support member 22). One end of the first movable electrode 25 is an unconstrained end. In the sensor 115 as well, at least one of the first surface 25f or the second surface 25g is non-parallel to the first member surface 41F. For example, the first surface 25f is convex, and the second surface 25g is concave. In the sensor 115 as well, a signal that corresponds to the flow of the fluid 35 (e.g., a signal that corresponds to the electrical capacitance) is obtained. For example, a low power-consumption flow rate sensor can be provided. A sensor can be provided in which the characteristics can be improved.

Figure 7A:
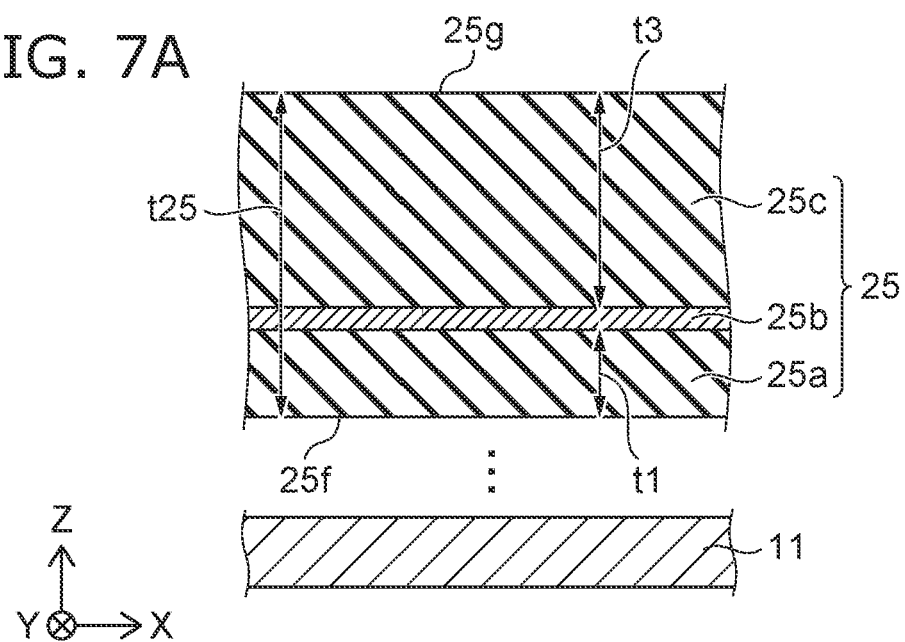
FIGS. 7A and 7B are schematic cross-sectional views illustrating a portion of the sensor according to the first embodiment.
Figure 7B:
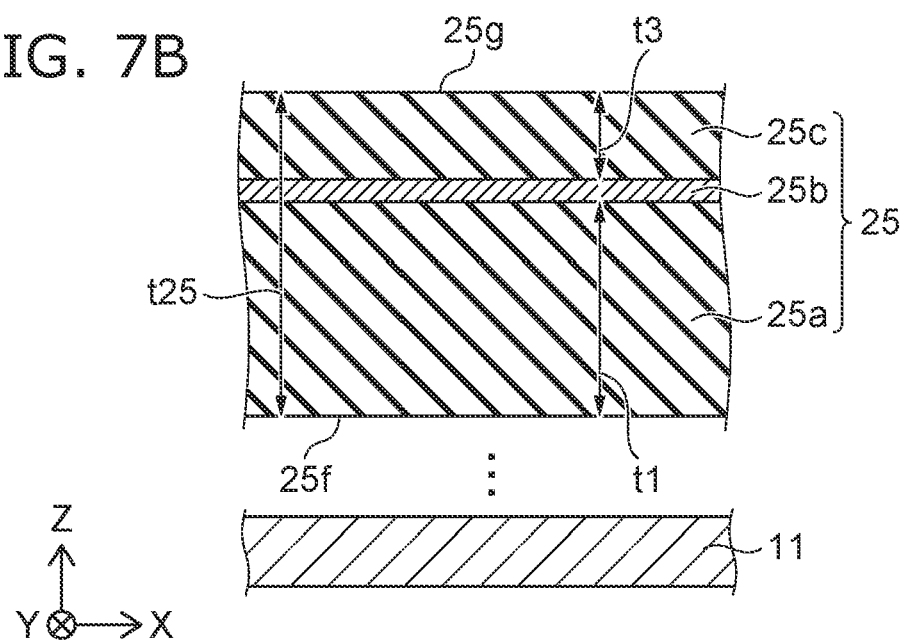

FIGS. 7A and 7B are schematic cross-sectional views illustrating a portion of the sensor according to the first embodiment.

These drawings illustrate the first movable electrode 25. As shown in FIGS. 7A and 7B, the first movable electrode 25 may include the first layer 25a, the second layer 25b, and a third layer 25c. The first layer 25a is between the first fixed electrode 11 and the third layer 25c. The second layer 25b is between the first layer 25a and the third layer 25c.

A thickness t1 of the first layer 25a is different from a thickness t3 of the third layer 25c. In the example of FIG. 7A, the thickness t1 is less than the thickness t3. In the example of FIG. 7B, the thickness t1 is greater than the thickness t3. The first movable electrode 25 may be curved due to such a thickness difference. For example, the first surface 25f is concave, and the second surface 25g is convex. Or, the first surface 25f is convex, and the second surface 25g is concave.

For example, the first layer 25a may include a material that is included in the third layer 25c. In one example, the first layer 25a and the third layer 25c are insulative, and the second layer 25b is conductive. For example, the first layer 25a and the third layer 25c include silicon and nitrogen; and the second layer 25b includes titanium and nitrogen.

In one example, a thickness t25 of the first movable electrode 25 (referring to FIGS. 7A and 7B) is not less than 0.5 μm and not more than 20 μm.

Second Embodiment

Figure 8:
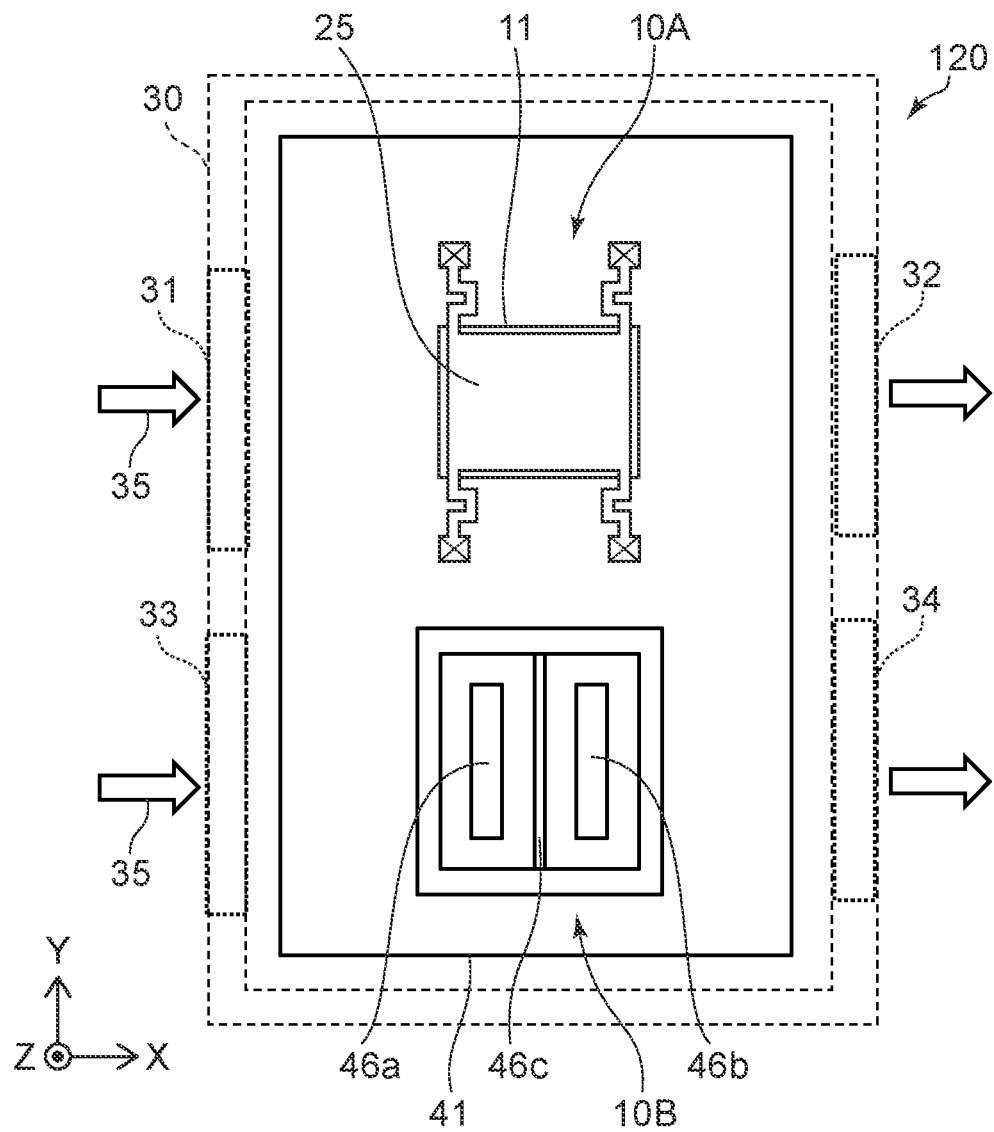
FIG. 8 is a see-through plan view illustrating a sensor according to a second embodiment.

FIG. 8 is a see-through plan view illustrating a sensor according to a second embodiment.

As shown in FIG. 8, the sensor 120 according to the embodiment includes a second element part 10B in addition to the first member 41 and the first element part 10A. For example, the second element part 10B is located at the first member 41. The electrical resistance that is obtained from the second element part 10B changes according to the fluid 35 flowing through the second element part 10B.

The second element part 10B includes, for example, a heater 46c, a first temperature detector 46a, and a second temperature detector 46b. The heater 46c is located between the first temperature detector 46a and the second temperature detector 46b in the X-axis direction. The distribution of the heat due to the heater 46c changes according to the fluid 35. The state of the flow of the fluid 35 can be detected by using the temperature difference between the first temperature detector 46a and the second temperature detector 46b. The second element part 10B is, for example, a thermal resistance-type flow rate sensor.

For example, a third opening 33 and a fourth opening 34 are provided in the housing 30. The fluid 35 flows in the path of the third and fourth openings 33 and 34. The second element part 10B is configured to output the change of the electrical resistance that corresponds to the flow of the fluid 35.

For example, the signal that is obtained from the first element part 10A may be used as the detection signal when the flow rate is large. The signal that is obtained from the second element part 10B may be used as the detection signal when the flow rate is small. Detection in a wide dynamic range is possible.

For example, a flow rate sensor of a reference example may be considered in which the fluid 35 is incident on the first movable electrode 25 along the Z-axis direction. The reference example is, for example, a paddle-type. In the reference example, the fluid 35 that is incident on the first movable electrode 25 outflows externally via holes in the first member 41. In the reference example, the formation of the holes is complex. Furthermore, in the reference example, detection in multi-axes is difficult. According to the embodiment, a simple configuration can be employed. Detection in multi-axes also is easy.

Embodiments may include the following configurations (e.g., technological proposals).

Configuration 1

A sensor, comprising:
a first member including a first member surface; and
a first element part,
the first element part including
a first fixed electrode fixed to the first member surface, the first fixed electrode being along the first member surface, and
a first movable electrode facing the first fixed electrode,
a gap being located between the first movable electrode and the first fixed electrode,
the first movable electrode including a first surface and a second surface,
the first surface being between the first fixed electrode and the second surface,
at least one of the first surface or the second surface being non-parallel to the first member surface.

Configuration 2

The sensor according to Configuration 1, wherein the first surface is convex or concave.

Configuration 3

The sensor according to Configuration 1 or 2, wherein the second surface is convex or concave.

Configuration 4

The sensor according to any one of Configurations 1 to 3, further comprising:
a housing,
the housing including a first opening and a second opening,
a first direction from the first opening toward the second opening being along the first member surface,
the at least one of the first surface or the second surface being non-parallel to the first member surface when the first movable electrode is cut at a first cross section,
the first cross section being perpendicular to the first member surface and being along the first direction.

Configuration 5

The sensor according to any one of Configurations 1 to 3, wherein an electrical capacitance between the first fixed electrode and the first movable electrode changes according to a flow of a fluid flowing along the first member surface through the gap.

Configuration 6
The sensor according to any one of Configurations 1 to 3, wherein
a distance between the first fixed electrode and the first movable electrode changes according to a flow of a fluid flowing along the first member surface through the gap.

Configuration 7
The sensor according to Configuration 5 or 6, wherein
the fluid can flow along the second surface.

Configuration 8
The sensor according to any one of Configurations 5 to 7, wherein
the fluid is a gas or a liquid.

Configuration 9
The sensor according to any one of Configurations 5 to 8, further comprising:
a housing,
the first element part being in the housing,
the housing including a first opening and a second opening,
a first direction from the first opening toward the second opening being along the first member surface,
the at least one of the first surface or the second surface being non-parallel to the first member surface when the first movable electrode is cut at a first cross section,
the first cross section being perpendicular to the first member surface and being along the first direction.

Configuration 10
The sensor according to Configuration 9, wherein
the fluid can pass through a path between the first opening and the second opening.

Configuration 11
The sensor according to Configuration 4, Configuration 9, or Configuration 10, wherein
a ratio of a warp amount of the first surface to a length of the first movable electrode along the first direction is not less than 0.002 and not more than 0.3.

Configuration 12
The sensor according to Configuration 4, Configuration 9, or Configuration 10, wherein
a ratio of a warp amount of the second surface to a length of the first movable electrode along the first direction is not less than 0.002 and not more than 0.3.

Configuration 13
The sensor according to any one of Configurations 1 to 12, wherein
the first movable electrode includes a first layer and a second layer,
the first layer is between the first fixed electrode and the second layer, and
the second layer includes a different material from a material of the first layer.

Configuration 14
The sensor according to any one of Configurations 1 to 12, wherein
the first movable electrode includes a first layer, a second layer, and a third layer,
the first layer is between the first fixed electrode and the third layer,
the second layer is between the first layer and the third layer, and
a thickness of the first layer is different from a thickness of the third layer.

Configuration 15
The sensor according to Configuration 14, wherein
the first layer includes a material included in the third layer.

Configuration 16
The sensor according to Configuration 14 or 15, wherein
the first layer and the third layer are insulative, and
the second layer is conductive.

Configuration 17
The sensor according to any one of Configurations 14 to 16, wherein
the first layer and the third layer include silicon and nitrogen, and
the second layer includes titanium and nitrogen.

Configuration 18
The sensor according to any one of Configurations 1 to 17, further comprising:
a second element part,
the second element part being located at the first member,
an electrical resistance obtained from the second element part changing according to a fluid flowing through the second element part.

According to embodiments, a sensor can be provided in which the characteristics can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in sensors such as first members, element parts, fixed electrodes, movable electrodes, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors practicable by an appropriate design modification by one skilled in the art based on the sensors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A sensor, comprising:
a first member including a first member surface; and
a first element part,
the first element part including
a first fixed electrode fixed to the first member surface, the first fixed electrode being along the first member surface, and a first movable electrode facing the first fixed electrode,
a gap being located between the first movable electrode and the first fixed electrode,
the first movable electrode including a first surface and a second surface,
the first surface being between the first fixed electrode and the second surface,
at least one of the first surface or the second surface being non-parallel to the first member surface,
wherein
the first movable electrode includes a first layer, a second layer, and a third layer,
the first layer is between the first fixed electrode and the third layer,
the second layer is between the first layer and the third layer,
a thickness of the first layer is different from a thickness of the third layer;
the first layer and the third layer are insulative, and
the second layer is conductive.

2. The sensor according to claim 1, wherein the first surface is convex or concave.

3. The sensor according to claim 1, wherein the second surface is convex or concave.

4. The sensor according to claim 1, further comprising:
a housing,
the housing including a first opening and a second opening,
a first direction from the first opening toward the second opening being along the first member surface,
the at least one of the first surface or the second surface being non-parallel to the first member surface when the first movable electrode is cut at a first cross section,
the first cross section being perpendicular to the first member surface and being along the first direction.

5. The sensor according to claim 4, wherein a ratio of a warp amount of the first surface to a length of the first movable electrode along the first direction is not less than 0.002 and not more than 0.3.

6. The sensor according to claim 4, wherein a ratio of a warp amount of the second surface to a length of the first movable electrode along the first direction is not less than 0.002 and not more than 0.3.

7. The sensor according to claim 1, wherein an electrical capacitance between the first fixed electrode and the first movable electrode changes according to a flow of a fluid flowing along the first member surface through the gap.

8. The sensor according to claim 7, wherein the fluid can flow along the second surface.

9. The sensor according to claim 7, wherein the fluid is a gas or a liquid.

10. The sensor according to claim 7, further comprising:
a housing,
the first element part being in the housing,
the housing including a first opening and a second opening,
a first direction from the first opening toward the second opening being along the first member surface,
the at least one of the first surface or the second surface being non-parallel to the first member surface when the first movable electrode is cut at a first cross section,
the first cross section being perpendicular to the first member surface and being along the first direction.

11. The sensor according to claim 10, wherein the fluid can pass through a path between the first opening and the second opening.

12. The sensor according to claim 1, wherein a distance between the first fixed electrode and the first movable electrode changes according to a flow of a fluid flowing along the first member surface through the gap.

13. The sensor according to claim 1, wherein
the first movable electrode includes a first layer and a second layer,
the first layer is between the first fixed electrode and the second layer, and
the second layer includes a different material from a material of the first layer.

14. The sensor according to claim 1, wherein the first layer includes a material included in the third layer.

15. The sensor according to claim 1, further comprising:
a second element part,
the second element part being located at the first member,
an electrical resistance obtained from the second element part changing according to a fluid flowing through the second element part.

16. A sensor, comprising:
a first member including a first member surface; and
a first element part,
the first element part including
a first fixed electrode fixed to the first member surface, the first fixed electrode being along the first member surface, and
a first movable electrode facing the first fixed electrode,
a gap being located between the first movable electrode and the first fixed electrode,
the first movable electrode including a first surface and a second surface,
the first surface being between the first fixed electrode and the second surface,
at least one of the first surface or the second surface being non-parallel to the first member surface,
wherein
the first movable electrode includes a first layer, a second layer, and a third layer,
the first layer is between the first fixed electrode and the third layer,
the second layer is between the first layer and the third layer,
a thickness of the first layer is different from a thickness of the third layer,
the first layer and the third layer include silicon and nitrogen, and
the second layer includes titanium and nitrogen.

17. A sensor, comprising:
a first member including a first member surface;
a first element part; and
a housing,
the first element part including
a first fixed electrode fixed to the first member surface, the first fixed electrode being along the first member surface, and
a first movable electrode facing the first fixed electrode,
a gap being located between the first movable electrode and the first fixed electrode,
the first movable electrode including a first surface and a second surface,
the first surface being between the first fixed electrode and the second surface,
at least one of the first surface or the second surface being non-parallel to the first member surface, the housing including a first opening and a second opening, a first direction from the first opening toward the second opening being along the first member surface, the at least one of the first surface or the second surface being non-parallel to the first member surface when the first movable electrode is cut at a first cross section, the first cross section being perpendicular to the first member surface and being along the first direction, wherein a ratio of a warp amount of the first surface to a length of the first movable electrode along the first direction is not less than 0.002 and not more than 0.3.

18. The sensor according to claim 17, wherein
a ratio of a warp amount of the second surface to a length of the first movable electrode along the first direction is not less than 0.002 and not more than 0.3.

* * * * *